(12) United States Patent
Long et al.

(10) Patent No.: US 10,886,301 B2
(45) Date of Patent: Jan. 5, 2021

(54) TEST CIRCUIT, ARRAY SUBSTRATE, DISPLAY PANEL, AND DISPLAY DEVICE

(71) Applicant: BOE TECHNOLOGY GROUP CO., LTD., Beijing (CN)

(72) Inventors: Chunping Long, Beijing (CN); Hui Li, Beijing (CN); Xinyin Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 17 days.

(21) Appl. No.: 16/462,638

(22) PCT Filed: Oct. 10, 2018

(86) PCT No.: PCT/CN2018/109643
§ 371 (c)(1),
(2) Date: May 21, 2019

(87) PCT Pub. No.: WO2019/072189
PCT Pub. Date: Apr. 18, 2019

(65) Prior Publication Data
US 2020/0075632 A1  Mar. 5, 2020

(30) Foreign Application Priority Data

Oct. 13, 2017 (CN) .................... 2017 2 1318496 U

(51) Int. Cl.
*H01L 21/00* (2006.01)
*H01L 27/12* (2006.01)
(Continued)

(52) U.S. Cl.
CPC .............. *H01L 27/12* (2013.01); *G01R 31/50* (2020.01); *G02F 1/1343* (2013.01);
(Continued)

(58) Field of Classification Search
CPC ........ H01L 27/12; G01R 31/50; G02F 1/1343
See application file for complete search history.

(56) References Cited

U.S. PATENT DOCUMENTS 10,197,877 B2 *  2/2019  Chan .................... G02F 1/1368
2009/0185126 A1  7/2009  Kim et al.
(Continued)

FOREIGN PATENT DOCUMENTS

CN  104485058 A  *  4/2015
CN  104485058 A     4/2015
(Continued)

OTHER PUBLICATIONS

Search Report and Written Opinion for International Application No. PCT/CN2018/109643 dated Jan. 7, 2019.

*Primary Examiner* — Laura M Menz
(74) *Attorney, Agent, or Firm* — Calfee, Halter & Griswold LLP

(57) ABSTRACT

An array substrate, a display panel, and a display device. The array substrate has a display area and a non-display area surrounding the display area. The array substrate further includes a plurality of signal lines located in the display area, a plurality of test signal lines and a plurality of test control transistors located in the non-display area and respectively corresponding to the plurality of signal lines. Each of the signal lines is connected to a respective one of the test signal lines by a respective one of the test control transistors. The plurality of test control transistors each have a channel width-to-length ratio between 10 and 200.

12 Claims, 1 Drawing Sheet

(51) Int. Cl.
*G01R 31/50* (2020.01)
*G02F 1/1343* (2006.01)
*G02F 1/1362* (2006.01)
*G09G 3/00* (2006.01)
*H01L 29/417* (2006.01)
*H01L 29/423* (2006.01)

(52) U.S. Cl.
CPC ......... *G02F 1/136286* (2013.01); *G09G 3/00* (2013.01); *H01L 29/41733* (2013.01); *H01L 29/42384* (2013.01)

(56) References Cited

U.S. PATENT DOCUMENTS

| | | | |
|---|---|---|---|
| 2018/0107080 A1* | 4/2018 | Chan | H01L 27/1214 |
| 2019/0123209 A1 | 4/2019 | Zeng et al. | |
| 2020/0075632 A1* | 3/2020 | Long | G02F 1/136286 |

FOREIGN PATENT DOCUMENTS

| | | | | |
|---|---|---|---|---|
| CN | 107153308 A | | 9/2017 | |
| CN | 107204375 A | | 9/2017 | |
| CN | 207183274 U | * | 4/2018 | ........... G02F 1/1343 |
| CN | 207183274 U | | 4/2018 | |
| JP | 2007178810 A | | 7/2007 | |
| WO | WO-2019072189 A1 | * | 4/2019 | ....... G02F 1/136286 |

* cited by examiner

TEST CIRCUIT, ARRAY SUBSTRATE, DISPLAY PANEL, AND DISPLAY DEVICE

CROSS-REFERENCE TO RELATED APPLICATIONS

The present application is the U.S. national phase entry of PCT/CN2018/109643, with an international filing date of Oct. 10, 2018, which claims priority to Chinese Patent Application No. 201721318496.2, filed on Oct. 13, 2017, the entire disclosures of which are hereby incorporated by reference.

TECHNICAL FIELD

The present disclosure relates to the field of display technologies, and in particular, to a test circuit, an array substrate, a display panel, and a display device.

BACKGROUND

Display devices have been used in large numbers as display screens for consumer electronics such as cell phones, notebook computers, personal computers, and personal digital assistants. A Display device typically includes an active matrix array substrate in which respective active components adjust their beam intensity to display an image. The array substrate includes a plurality of gate lines, a plurality of data lines, and a plurality of pixel units electrically connected to corresponding ones of the gate lines and corresponding ones of the data lines. Lead lines for the gate lines, the data lines, common electrode lines, and other signal lines are arranged at peripheral areas of the array substrate, thereby leading the gate lines, the data lines, the common electrode lines, and other signal lines to the bonding pads via which they are connected to control circuit chips. Before the box-alignment of the array substrate with the color filter substrate, it is generally necessary to test the array substrate in order to find possible manufacturing defects such as open circuit, short circuit, point defect, etc., and to get repaired in time. After the completion of the box-alignment, it is also necessary to test the liquid crystal display device to grade the liquid crystal panel and detect the defects occurred during the box-alignment.

SUMMARY

An embodiment of the present disclosure provides a test circuit comprising a plurality of test signal lines and a plurality of test control transistors, wherein a plurality of signal lines to be tested are respectively connected to corresponding ones of the test signal lines through corresponding ones of the test control transistors, and each of the test control transistors has a channel width-to-length ratio between 10 and 200.

According to some embodiments of the present disclosure, each of the test control transistors comprises an interdigital source, an interdigital drain, and a semiconductor film that is located between the interdigital source and the interdigital drain and forms a channel.

According to some embodiments of the present disclosure, each of the interdigital sources comprises at least two first finger electrodes, a pitch between adjacent ones of the first finger electrodes is between 2 and 20 microns, and the first finger electrode has a width between 2 and 20 microns and a length between 10 and 200 microns. Each of the interdigital drains comprises at least two second finger electrodes, a pitch between adjacent ones of the second finger electrodes is between 2 and 20 microns, and the second finger electrode has a width between 2 and 20 microns and a length between 10 and 200 microns.

According to some embodiments of the present disclosure, the interdigital source of each of the test control transistors is connected to a respective one of the plurality of test signal lines, and the interdigital drain of each of the test control transistors is connected to a respective one of the plurality of signal lines to be tested.

According to some embodiments of the present disclosure, the interdigital source of each of the test control transistors is connected to the respective one of the plurality of test signal lines through a via.

According to some embodiments of the present disclosure, a pitch between adjacent first finger electrodes and second finger electrodes is 4 microns, and each of the first and second finger electrodes has a length greater than 10 microns.

Another embodiment of the present disclosure provides an array substrate comprising a display area, a non-display area surrounding the display area, and any of the test circuits described above. The plurality of signal lines to be tested are disposed in the display area, and the test circuit is disposed in the non-display area.

According to some embodiments of the present disclosure, the array substrate further comprises at least one gate line disposed in the display area. The plurality of signal lines to be tested are data lines, and the plurality of test control transistors are arranged side by side and are controlled by a same one of the at least one gate line.

According to some embodiments of the present disclosure, the same one of the at least one gate line has a hollow portion between adjacent ones of the test control transistors.

According to some embodiments of the present disclosure, the same one of the at least one gate line is disposed in parallel with the plurality of test signal lines.

According to some embodiments of the present disclosure, the plurality of test signal lines arranged in parallel comprise at least three parallel test signal lines, a pitch between adjacent ones of the test signal lines is between 2 and 20 microns, and each of the test signal lines has a width between 2 and 20 microns.

According to some embodiments of the present disclosure, a width of the hollow portion is smaller than a pitch between adjacent ones of the test control transistors, and a length of the hollow portion is smaller than a width of the same one of the at least one gate line.

According to some embodiments of the present disclosure, the array substrate further comprises a plurality of gate lines disposed in the display area. The plurality of signal lines to be tested are data lines, the plurality of test control transistors are controlled by respective different ones of the gate lines, and the plurality of test control transistors are connected to a same one of the test signal lines.

Yet another embodiment of the present disclosure provides a display panel comprising any of the array substrates described above.

A further embodiment of the present disclosure provides a display device comprising the display panel described above.

BRIEF DESCRIPTION OF THE DRAWINGS

For a more clear illustration of the technical solutions of embodiments of the present disclosure, the accompany drawings of the embodiments will be briefly described below. It is apparent that the drawings in the following description relate only to some of the embodiments of the present disclosure, and are not to limit the disclosure. In the drawings.

DETAILED DESCRIPTION

The technical solutions of the embodiments of the present disclosure will be clearly and completely described below in conjunction with the drawings of the embodiments of the present disclosure, in order to render more clear the objectives, the technical solutions, and the advantages of the embodiments of the present disclosure. It is apparent that the described embodiments are part of the embodiments of the present disclosure, and not all of the embodiments. All other embodiments, derived by a person of ordinary skill in the art from the described embodiments of the present disclosure without paying inventive efforts, are within the scope of the present disclosure.

Unless otherwise defined, technical terms or scientific terms used in the present disclosure are intended to be understood in their ordinary meanings by the person of ordinary skill in the art. The words "first," "second," and similar terms used in the embodiments of the present disclosure do not denote any order, quantity, or importance, but are merely used to distinguish different components. The word "comprising" or "comprises" or the like means that the element or item preceding the word encompasses the listed element or item following the word, or equivalents thereof, without precluding other elements or items. The words "connect" or "connected" and the like are not limited to physical or mechanical connections, but may include electrical connections, whether direct or indirect. "Upper", "lower", "left", "right", etc. are only used to indicate the relative positional relationship, and when the absolute position of the object described is changed, the relative positional relationship may also change accordingly.

Figure 1:
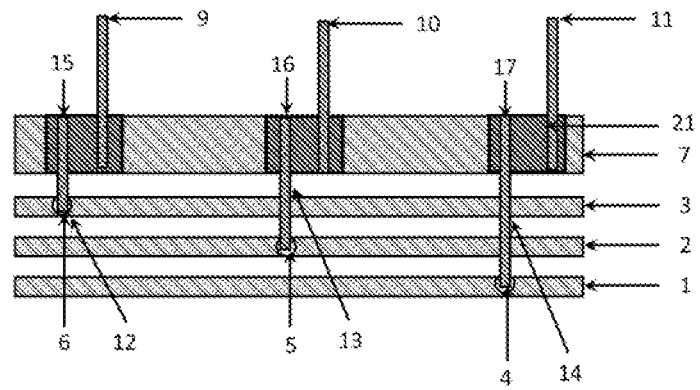
FIG. 1 is a schematic view of an array substrate.

In order to test the array substrate, a test circuit including test signal lines and test control transistors may be provided in a peripheral non-display area of the array substrate. The test signal lines and the test control transistors are connected to various signal lines such as data lines for testing the signal lines. Due to the popularization of large-size, high-resolution display screens, the data lines are increasing in quantity and are becoming longer in size. FIG. 1 shows a typical test circuit in which the test signal lines include a first test signal line 3, a second test signal line 2, and a third test signal line 1 arranged side by side. The signal lines to be tested include a first data line 9, a second data line 10, and a third data line 11 arranged side by side, and respective ends thereof are respectively connected to the drains of respective test control transistors. A source 15 of a first one of the test control transistors is connected to a first source connection line 12, and the first source connection line 12 is connected to the first test signal line 3 through a via 6. A source 16 of a second one of the test control transistors is connected to a second source connection line 13, and the second source connection line 13 is connected to the second test signal line 2 through a via 5. A source 17 of a third one of the test control transistors is connected to a third source connection line 14, and the third source connection line 14 is connected to the third test signal line 1 through a via 4.

In the test circuit shown in FIG. 1, each of the test control transistors has a similar size to that of a switching transistor in the pixel area, and the RC loads of the test signal lines are much larger than the RC load of the pixel unit, such that it takes longer time for the test signal lines to charge/discharge the data lines, resulting in longer test time periods, lower productivity, and higher manufacturing costs.

It should be noted that although not shown in the drawings, an array substrate typically includes a display area and a non-display area disposed at the periphery of the display area and surrounding the display area, as is known to those skilled in the art. The display area of the array substrate generally includes a plurality of pixel units, a plurality of gate lines, a plurality of data lines, a plurality of common electrode lines, a common electrode, and a plurality of other signal lines. Here, the introduction of the integral elements of the array substrate is illustrative and non-limiting; the concepts of the present disclosure are equally applicable to other array substrate structures and variations known in the art.

In the display area of the array substrate, a plurality of signal lines are arranged side by side, and the signal lines may be a plurality of gate lines arranged in parallel, or a plurality of data lines arranged in parallel.

In embodiments of the present disclosure, the non-display area disposed around the display area includes a plurality of test signal lines and a plurality of test control transistors. Each of the signal lines in the display area is connected to a respective one of the test signal lines through a respective one of the test control transistors. Specifically, the plurality of test control transistors each have a channel width-to-length ratio between 10 and 200. By setting the channel width-to-length ratio of the test control transistor in the above range, the charging current of the test control transistor can be significantly increased, thereby facilitating quick loading of the test signals onto corresponding signal lines through the test signal lines and the test control transistors, shortening the test time, increasing the production capacity, and reducing the production costs.

Figure 2:
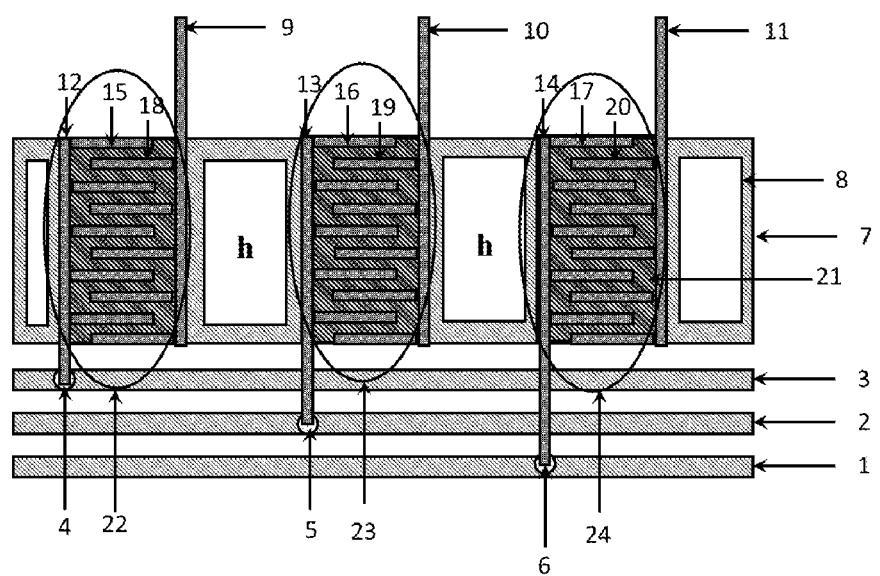
FIG. 2 is a schematic view of an array substrate including a test circuit according to an embodiment of the present disclosure.

Embodiments of the present disclosure will be described in detail below with reference to FIG. 2. Assume an example where the signal lines to be tested are data lines, as shown in FIG. 2, the signal lines to be tested arranged side by side include a first data line 9, a second data line 10, and a third data line 11. The test signal lines include a first test signal line 3, a second test signal line 2, and a third test signal line 1, wherein the first test signal line 3, the second test signal line 2, and the third test signal line 1 are arranged side by side.

As shown in FIG. 2, the sources and drains of the three test control transistors each have an interdigital structure including a plurality of finger electrodes that are parallel to each other. Accordingly, in the present disclosure, a source having an interdigital structure is referred to as an interdigital source, and a drain having an interdigital structure is referred to as an interdigital drain. In an exemplary embodiment, the first interdigital source 15, the second interdigital source 16, and the third interdigital source 17 may each include five metal wires arranged in parallel, and in certain exemplary embodiments, the five metal wires may have the same width, length, and pitch. Alternatively, these metal wires may have different widths, lengths, and pitches depending on the design of the particular product. In an exemplary embodiment, the metal wires may each have a width between 2 and 20 microns, a length between 10 and 200 microns, and a pitch between 2 and 20 microns. In an exemplary embodiment, the first interdigital drain 18, the second interdigital drain 19, and the third interdigital drain 20 each include five parallel metal wires having the same width, length and pitch, for example, a width between 2 and 20 microns, a length between 10 and 200 microns, and a pitch between 2 and 20 microns. In particular, each of the test control transistors has a channel width-to-length ratio greater than 10 and less than 200.

It should be noted that although the concept of the present disclosure has been described above by taking the interdigital structure of each of the source and drain including five metal wires as an example, each interdigital structure may alternatively include other numbers of metal wires, such as 2, 3, or 6, with the pitch of the metal wires between 2 and 20 microns, as will be appreciated by those skilled in the art.

In an embodiment of the present disclosure, the pitch between the metal wires in the interdigital source and the metal wires in the interdigital drain that are adjacent to each other is 4 microns, and each of the metal wires has a length exceeding 10 microns. As a result, the respective test control transistors have the same channel width, which exceeds 50 microns, and the respective test control transistors have the same channel length, which is 4 microns. Alternatively, the test control transistors may have different channel widths and lengths depending on the design of the particular product.

A semiconductor thin film from which an active region 21 is formed may be a thin film of amorphous silicon, polycrystalline silicon, or oxide semiconductor. As shown in FIG. 2, the semiconductor thin film is located among the source interdigital fingers and the drain interdigital fingers to form a channel of the test control transistor.

As shown in FIG. 2, a first test control transistor 22 formed by a first interdigital source 15, a first interdigital drain 18, a gate line 7 and a portion of the active region 21 is connected to the first data line 9, and to the first test signal line 3 through a first source connection line 12. A second test control transistor 23 formed by a second interdigital source 16, a second interdigital drain 19, the gate line 7 and a portion of the active region 21 is connected to the second data line 10, and to the second test signal line 2 through a second source connection line 13. A third test control transistor 24 formed by a third interdigital source 17, a third interdigital drain 20, the gate line 7 and a portion of the active region 21 is connected to the third data line 11, and to the third test signal line 1 through a third source connection line 14.

As shown in FIG. 2, the test control transistors 22, 23, and 24 are arranged side by side, and are arranged to be connected, in a one-to-one correspondence, to the data lines 9, 10, and 11 arranged side by side. The gates of the respective test control transistors described above correspond to different portions of the same gate line 7, so that a gate control signal is supplied from the same gate line 7 to the respective test control transistors 22, 23, and 24 arranged side by side. In certain exemplary embodiments, as shown in FIG. 2, the gate line 7 has a hollow portion h between adjacent test control transistors, with a width of the hollow portion h being slightly smaller than the pitch of adjacent test control transistors, and a length of the hollow portion h being slightly smaller than the width of the gate line 7. As used herein, the width of the hollow portion is the size of the hollow portion in the extending direction of the gate line, and the length of the hollow portion is the size of the hollow portion in a direction perpendicular to the extending direction of the gate line. The hollow portion reduces the metal area of the gate line 7, thereby facilitating the reduction of plasma damage due to an antenna effect during the process.

In an alternative embodiment, instead of using the same gate line 7 to supply the gate control signal, three or other number of gate lines may be used to sequentially control the test control transistors, so as to implement different test modes. For example, the first test control transistor 22 connected to the first data line 9 is controlled by a first test control gate line, the second test control transistor 23 connected to the second data line 10 is controlled by a second test control gate line, and the third test control transistor 24 connected to the third data line 11 is controlled by a third test control gate line. In such an embodiment, the sources of the first test control transistor, the second test control transistor, and the third test control transistor may all be connected to the same test signal line instead of being connected to respective ones of a plurality of test signal lines arranged side by side. The first test control gate line, the second test control gate line, and the third test control gate line may be arranged side by side in parallel, and are applied with control signals of different timings.

Returning to FIG. 2, the first data line 9, the second data line 10, and the third data line 11, together with the third test signal line 1, the second test signal line 2, and the first test signal line 3, correspond one-to-one to the three test control transistors 22, 23 and 24, respectively. That is, the sources of the three test control transistors 22, 23 and 24 are respectively connected to the first test signal line 3, the second test signal line 2, and the third test signal line 1 in a one-to-one correspondence, and the drains of the three test control transistors are respectively connected to the first data line 9, the second data line 10, and the third data line 11 in a one-to-one correspondence.

The first test control transistor 22 includes the first interdigital source 15 and the first interdigital drain 18, with the first interdigital source 15 being connected to the first source connection line 12, and the first source connection line 12 being connected to the first test signal line 3 through a first via 4. The second test control transistor 23 includes the second interdigital source 16 and the second interdigital drain 19, with the second interdigital source 16 being connected to the second source connection line 13, and the second source connection line 13 being connected to the second test signal line 2 through a second via 5. The third test control transistor 24 includes the third interdigital source 17 and the third interdigital drain 20, with the third interdigital source 17 being connected to the third source connection line 14, and the third source connection line 14 being connected to the third test signal line 1 through a third via 6.

In the above embodiments of the present disclosure, it is to be noted that the plurality of metal wires forming the first interdigital source 15, the second interdigital source 16, and the third interdigital source 17 and the plurality of metal wires forming the first interdigital drain 18, the second interdigital drain 19 and the third interdigital drain 20 may also be referred to herein as finger electrodes of the test control transistors, such that the first interdigital source 15, the second interdigital source 16, the third interdigital source 17, the first interdigital drain 18, the second interdigital drain 19, and the third interdigital drain 20 each have the interdigital structure.

In the embodiment shown in FIG. 2, the first test control transistor 22 includes the first interdigital source 15 and the first interdigital drain 18, the second test control transistor 23 includes the second interdigital source 16 and the second interdigital drain 19, and the third test control transistor 24 includes the third interdigital source 17 and the third interdigital drain 20. As described above, the gates of the first test control transistor 22, the second test control transistor 23, and the third test control transistor 24 are each part of the gate line 7, and the gate line 7, the first test signal line 3, the second test signal line 2, and the third test signal line 1 are arranged side by side. The first test signal line 3, the second test signal line 2, and the third test signal line 1 are parallel to each other and are parallel to the gate line 7. In particular, the pitch and width of the first test signal line 3, the second test signal line 2, and the third test signal line 1 are between 2 and 20 microns. Such a compact design enables the first test signal line 3, the second test signal line 2, and the third test signal line 1 to be arranged side by side in parallel with the gate line 7, and the pitch and width of the test signal lines facilitate implementation of a narrow bezel in a high resolution panel. Embodiments of the present application further provide a display panel including the array substrate described in any of the foregoing technical solutions.

Embodiments of the present application further provide a display device including the array substrate described in any of the foregoing technical solutions.

The display panel and display device employ the array substrate provided by the embodiments of the present disclosure, with the width-to-length ratio of the channel of the test control transistor between 10 and 200, thereby increasing the charging current of the test control transistor, shortening the test time, increasing the production capacity, and reducing the production costs.

The foregoing are only specific embodiments of the present disclosure, and the scope of the present disclosure is not limited thereto. Variations or substitutions that can be easily conceived of by any person skilled in the art should be encompassed within the scope of the present disclosure. Thus, the scope of the present disclosure should be defined by the claims.

What is claimed is:

1. A test circuit, comprising:
  a plurality of test signal lines; and
  a plurality of test control transistors;
  wherein the plurality of test control transistors are configured to connect respective ones of the plurality of test signal lines to respective ones of a plurality of signal lines to be tested;
  wherein each of the test control transistors has a channel width-to-length ratio between 10 and 200; and
  wherein each of the test control transistors comprises an interdigital source, an interdigital drain, and a semiconductor film that is between the interdigital source and the interdigital drain and forms a channel.

2. The test circuit of claim 1, wherein:
  the interdigital source of each of the test control transistors comprises at least two first finger electrodes, a pitch between adjacent ones of the first finger electrodes is between 2 and 20 microns, and each of the first finger electrodes has a width between 2 and 20 microns and a length between 10 and 200 microns; and
  the interdigital drain of each of the test control transistors comprises at least two second finger electrodes, a pitch between adjacent ones of the second finger electrodes is between 2 and 20 microns, and each of the second finger electrodes has a width between 2 and 20 microns and a length between 10 and 200 microns.

3. The test circuit of claim 1, wherein:
  the interdigital source of each of the test control transistors is connected to a respective one of the plurality of test signal lines; and
  the interdigital drain of each of the test control transistors is connected to a respective one of the plurality of signal lines to be tested.

4. The test circuit of claim 3, wherein the interdigital source of each of the test control transistors is connected to the respective one of the plurality of test signal lines through a via.

5. The test circuit of claim 2, wherein:
  a pitch between each of the first finger electrodes and a respective adjacent one of the second finger electrodes is 4 microns; and
  each of the first and second finger electrodes has a length greater than 10 microns.

6. An array substrate, comprising:
  a display area;
  a non-display area surrounding the display area;
  a plurality of signal lines to be tested; and
  a test circuit comprising a plurality of test signal lines and a plurality of test control transistors, wherein the plurality of test control transistors are configured to connect respective ones of the plurality of test signal lines to respective ones of the plurality of signal lines to be tested, and wherein each of the test control transistors has a channel width-to-length ratio between 10 and 200;
  wherein the plurality of signal lines to be tested are in the display area;
  wherein the test circuit is in the non-display area; and
  wherein each of the test control transistors comprises an interdigital source, an interdigital drain, and a semiconductor film that is between the interdigital source and the interdigital drain and forms a channel.

7. A display panel comprising the array substrate of claim 6.

8. A display device comprising the display panel of claim 7.

9. The array substrate of claim 6, wherein:
  the interdigital source of each of the test control transistors comprises at least two first finger electrodes, a pitch between adjacent ones of the first finger electrodes is between 2 and 20 microns, and each of the first finger electrodes has a width between 2 and 20 microns and a length between 10 and 200 microns; and
  the interdigital drain of each of the test control transistors comprises at least two second finger electrodes, a pitch between adjacent ones of the second finger electrodes is between 2 and 20 microns, and each of the second finger electrodes has a width between 2 and 20 microns and a length between 10 and 200 microns.

10. The array substrate of claim 6, wherein:
  the interdigital source of each of the test control transistors is connected to a respective one of the plurality of test signal lines; and
  the interdigital drain of each of the test control transistors is connected to a respective one of the plurality of signal lines to be tested.

11. The array substrate of claim 10, wherein the interdigital source of each of the test control transistors is connected to the respective one of the plurality of test signal lines through a via.

12. The array substrate of claim 9, wherein:
  a pitch between each of the first finger electrodes and a respective adjacent one of the second finger electrodes is 4 micrometers; and each of the first and second finger electrodes has a length greater than 10 microns.

* * * * *